United States Patent
Geuskens et al.

(10) Patent No.: US 8,456,923 B2
(45) Date of Patent: Jun. 4, 2013

(54) REGISTER FILE CIRCUITS WITH P-TYPE EVALUATION

(75) Inventors: Bibiche Geuskens, Beaverton, OR (US); Ataur Patwary, Portland, OR (US); Eric Kwesi Donkoh, Hillsboro, OR (US); Muhammad Khellah, Tigard, OR (US); Tanay Karnik, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 698 days.

(21) Appl. No.: 12/317,000

(22) Filed: Dec. 18, 2008

(65) Prior Publication Data
US 2010/0157705 A1    Jun. 24, 2010

(51) Int. Cl.
*G11C 7/00*    (2006.01)

(52) U.S. Cl.
USPC ...................................... 365/189.02; 365/227

(58) Field of Classification Search
USPC ............................................ 365/189.02, 227
See application file for complete search history.

(56) References Cited

U.S. PATENT DOCUMENTS

| | | | |
|---|---|---|---|
| 5,952,861 A | 9/1999 | Kim et al. | |
| 6,320,795 B1 | 11/2001 | Balamurugan et al. | |
| 7,200,068 B2 | 4/2007 | Khellah et al. | |
| 7,236,410 B2 | 6/2007 | Schrom et al. | |
| 7,558,097 B2 | 7/2009 | Khellah et al. | |
| 7,952,941 B2 | 5/2011 | Wijeratne et al. | |
| 2009/0172283 A1 | 7/2009 | Khellah et al. | |
| 2009/0251974 A1* | 10/2009 | Chu et al. | 365/189.02 |
| 2010/0073994 A1 | 3/2010 | Khalil et al. | |

OTHER PUBLICATIONS

Office action received for Korean Patent Application No. 2009-0125936, mailed on Feb. 25, 2011, 2 pages of English translation only.

Hamzaoglu et al., "Circuit-Level Techniques to Control Gate Leakage for sub-100nm CMOS", ACM Digital Library, Aug. 12-14, 2002, pp. 60-63.

* cited by examiner

*Primary Examiner* — Jason Lappas
(74) *Attorney, Agent, or Firm* — Blakely, Sokoloff, Taylor & Zafman LLP

(57) ABSTRACT

Provided herein is a new RF implementation. Instead of using a pre-charged High node for one or more of its evaluation nodes, it employs an evaluation (or evaluate) node that is discharged (Low) prior to evaluation and enters evaluation in a discharged state. In some embodiments, with such "normally Low" evaluation nodes, it uses pull-up stack devices, rather than pull-down devices, to charge the evaluate node during an evaluate phase if the logic so dictates.

13 Claims, 3 Drawing Sheets

REGISTER FILE CIRCUITS WITH P-TYPE EVALUATION

BACKGROUND

Dynamic register files (RFs) are commonly used, e.g., in microprocessors, for storing and reading arrays of data. They are particularly useful in areas where throughput is important. Reading data out of an RF is typically done using dynamic selection and evaluation, e.g., with a wide dynamic multiplexer or NOR circuitry and hence, leakage current as well as dynamic power play an important role in the total power consumption of an RF circuit. Accordingly, improved approaches would be desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
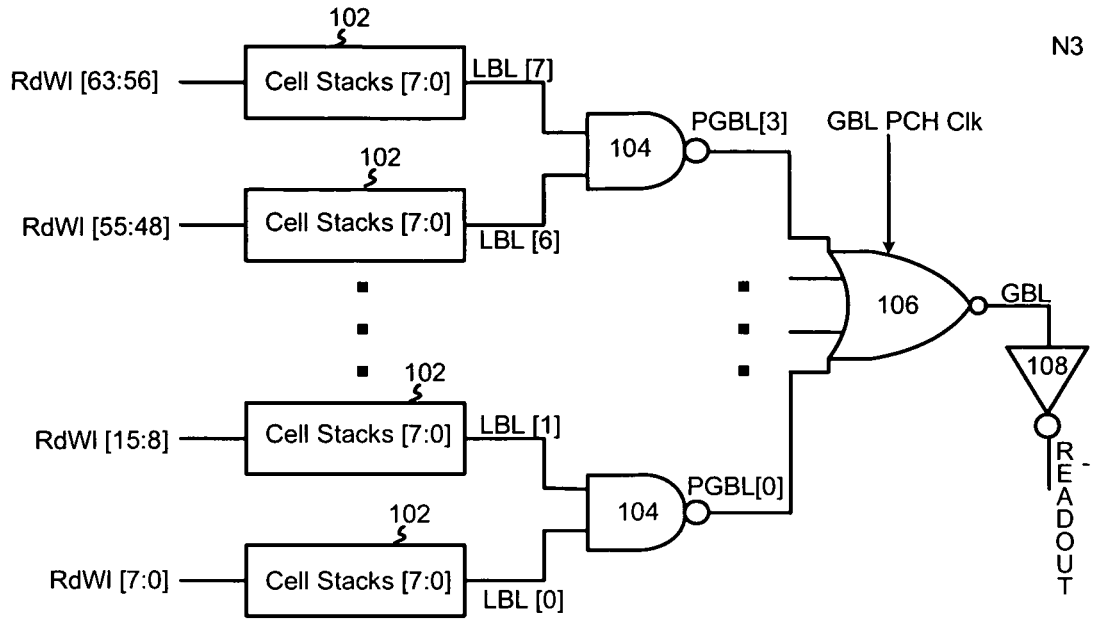
FIG. 1 is a diagram of a conventional RF column.

With reference to FIG. 1, a conventional RF column (in this case, a 64-bit column) is shown. (For simplicity and ease of understanding, a single 64 bit RF column is shown, but in many applications, there would be a number of such columns, e.g., 32 columns in an RF array configuration, resulting in 32, 64-bit registers, or RF words). The depicted RF is organized into eight groups 102, with each group having eight cell stacks, thus making up 64 cell stacks for the 64 bit column.

A read word line (RdWl) is provided for each cell stack to evaluate (or "read") the cell stack when the word line is asserted. Each word line (RdWl) is driven from a decoder driver, typically formed from a NAND gate followed by an inverter to achieve the necessary active-High input lines (neither device is shown here). Thus, with such a configuration, one word line is asserted at a time (e.g., per read cycle). Each group 102 of cell stacks shares a common local bit line (LBL) for evaluating a selected cell stack from the shared cell stacks in the group. The local bit lines are pre-charged to a High level and depending on the logic value stored in the cell to be read, the bit line either stays High or discharges Low upon evaluation.

There are four gates 104 (NAND gates here) to combine the eight local bit lines into four pre global bit lines (PGBLs). With this arrangement, each gate 104 receives two local bit lines and outputs a pre global bit line for evaluating its two local bit lines. Thus, the four PGBL lines represent the 64 cell stacks of the column. They each feed into a dynamic NOR gate 106, which in turn, has a global bit line (GBL) output that feeds into an output driving inverter 108. The dynamic NOR gate 106 is clocked (pre-charged/evaluated) with a GBL pre-charge clock signal (GBL PCH Clk) that may be delayed relative to the LBL precharge clock to give the PGBL inputs a chance to set up in response to the local bit lines evaluating. The global bit line (GBL) output from dynamic NOR gate 106 is inverted and driven through inverting driver 108 and provided as an output (READOUT), outputting the value read for the selected cell within the column.

Figure 2:
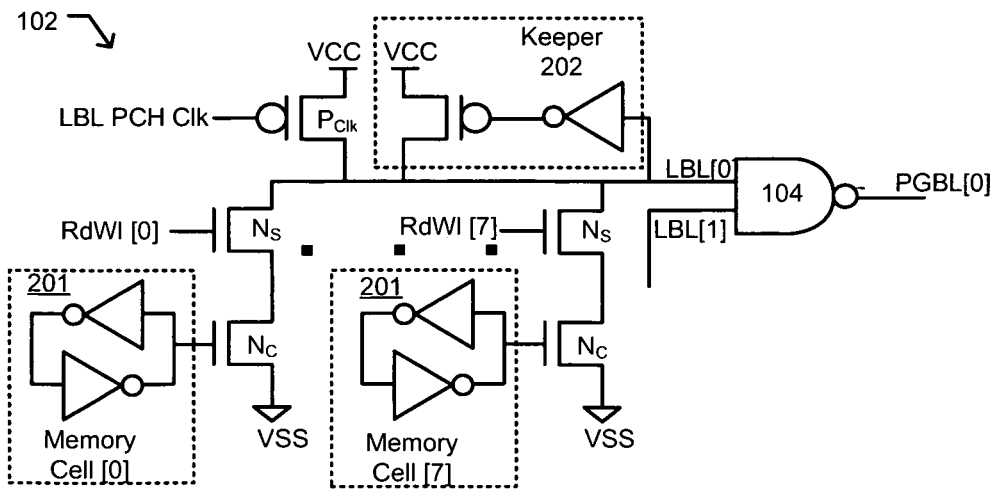
FIG. 2 is a diagram of a conventional cell stack group for the column of FIG. 1.

FIG. 2 shows conventional circuitry for a cell stack group 102. The circuit has eight cell stacks, each formed from a memory cell 201, an N-type cell transistor ($N_C$), and an N-type stack transistor ($N_S$) coupled to the local bit line (which is an evaluate or state node for this dynamic gate). The circuit also has a P-type precharge transistor ($P_{Clk}$) and a keeper circuit 202 formed from a P-type transistor and inverter, as shown. The RdWl signals are coupled to the gates of the stack transistors ($N_S$), which are disposed between the local bit line (LBL) and an associated cell transistor ($N_C$). During a precharge phase, all of the word line (RdWl) signals are de-asserted (Low), thereby turning off the stack transistors ($N_S$), and the precharge transistor ($P_{Clk}$) is asserted, via a local bit line clock (LBL PCH Clk), to charge the local bit line (LBL) High. During a subsequently occurring evaluation phase, the precharge transistor is turned off and if one of the cell stacks is to be read, its word line (RdWl) is asserted (High). This couples the local bit line to its associated memory cell through its cell transistor ($N_C$). So, depending on the stored state of its memory cell, the cell transistor either turns on, thereby "pulling down" the local bit line through the stack transistor, or the local bit line stays High. As is well known, the keeper circuit 202 serves to keep the LBL High if it is suppose to evaluate High, i.e., if the selected memory cell applies a Low to its associated cell transistor ($N_C$).

Figure 3:
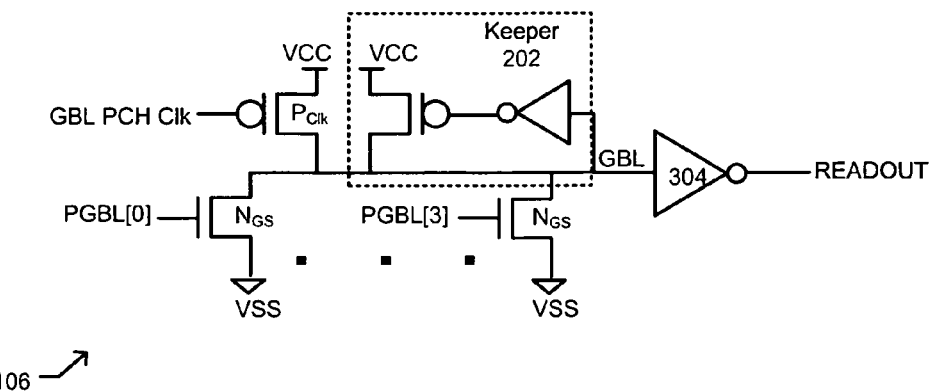
FIG. 3 is a diagram of a conventional dynamic NOR gate for the column of FIG. 1.

FIG. 3 shows a conventional dynamic NOR circuit 106 for the RF column of FIG. 1. it has four pull-down stack transistors NS, a precharge transistor PClk, and keeper circuit 202, all coupled to an evaluate node, serving as the global bit line (GBL), as is shown. The stack transistors each receive one of the precharge global bit line (PGBL) signals and if its PGBL signal is asserted (High), functions to pull down the GBL node when the gate evaluates, i.e., after $P_{Clk}$ has turned off.

Figure 4:
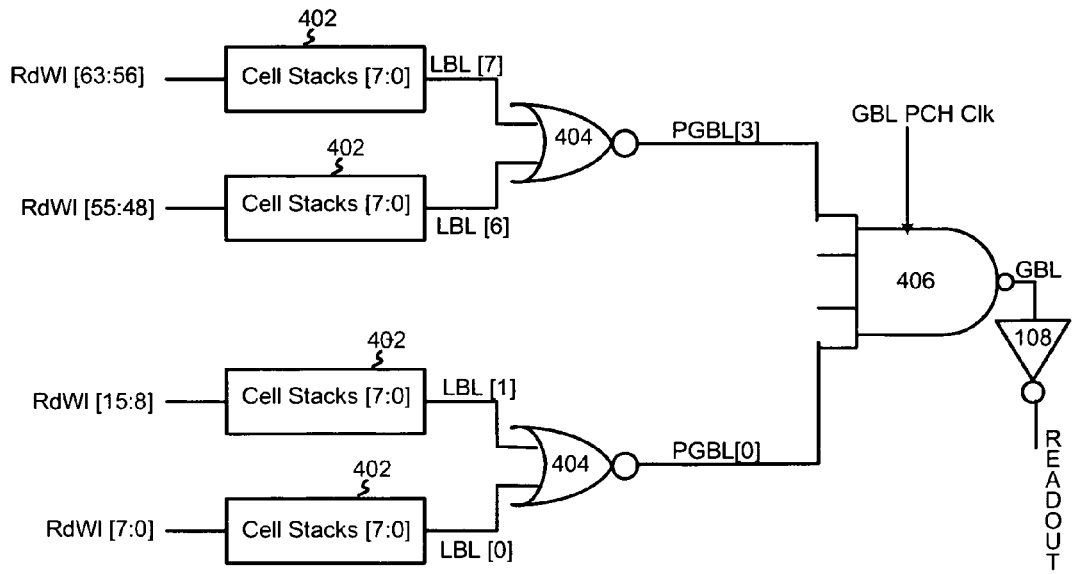
FIG. 4 is a diagram of an RF column with bit lines having discharged evaluation nodes in accordance with some embodiments.
Figure 5:
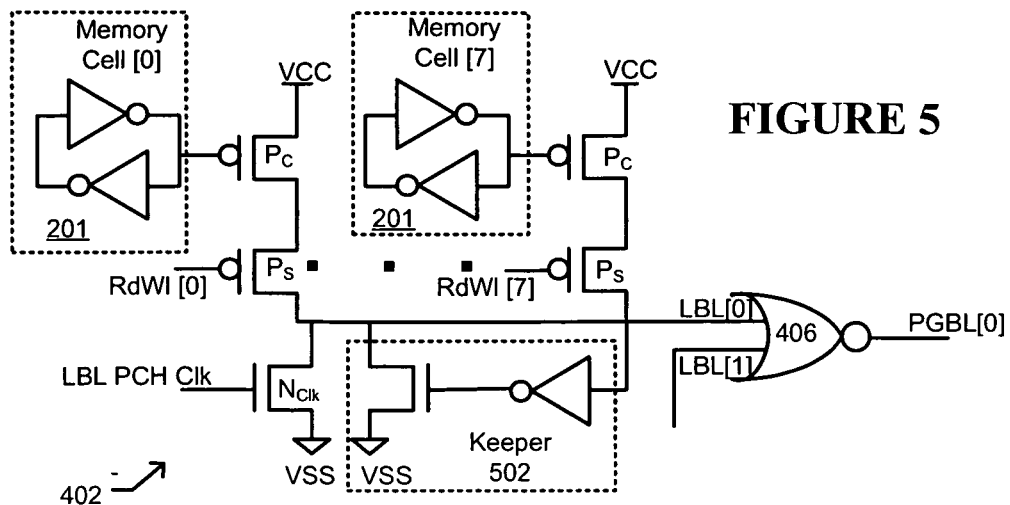
FIG. 5 is a diagram of a cell stack group with a bit line having a discharged evaluation node for the RF column of FIG. 4 in accordance with some embodiments.
Figure 6:
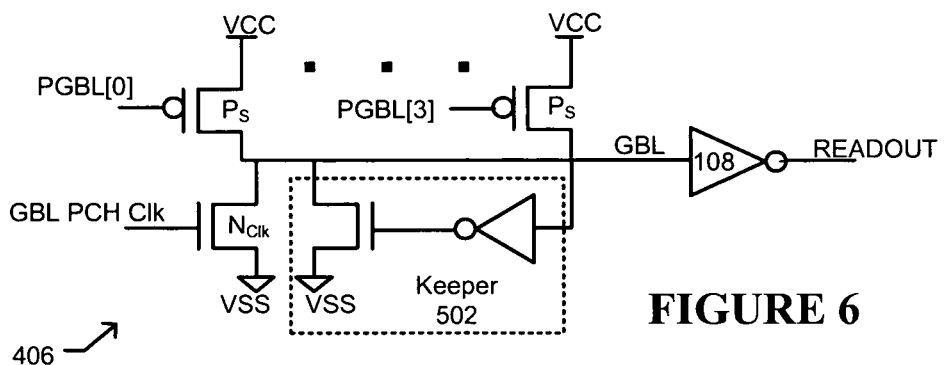
FIG. 6 is a diagram of a dynamic NAND gate for the column of FIG. 4 in accordance with some embodiments.

With reference to FIGS. 4-6, disclosed herein is a new RF implementation. Instead of using a pre-charged High node for one or more of its evaluation nodes, it employs an evaluation (or evaluate) node that is discharged (Low) prior to evaluation and enters evaluation in a discharged state. In some embodiments, with such "normally Low" evaluation nodes, it uses pull-up stack devices, rather than pull-down devices, to charge the evaluate node during an evaluate phase if the logic so dictates.

With reference to FIG. 4, an RF column (64 bit in this example) with discharged pre-evaluation in accordance with some embodiments is shown. It has cell stack groups 402 with LBL lines that discharge prior to being evaluated. The LBL lines feed into NOR gates 404. The NOR gates provide four PGBL lines that in turn feed into a dynamic NAND gate 406. In the depicted embodiment, dynamic NAND gate 406 outputs a global bit line (GBL) that, as with the LBL lines, is discharged (Low) prior to evaluation. (This is not required for all embodiments, for example, the GBL may be pre-charged, as with conventional implementations, or it may even be implemented with static or partially static logic.) The GBL line is fed into inverting output driver 108, which provides at its output the READOUt signal.

Because of the change in signal polarity, relative to the conventional circuits of FIGS. 1-3, for example, the RdWl drivers (not shown) should be active Low and hence, the utilized driver may be simplified to a NAND gate and the normally included inverter omitted.

FIG. 5 shows a circuit for implementing circuit 402 of FIG. 4 in accordance with some embodiments. Its evaluation node (LBL) is discharged Low during a pre-evaluation phase by discharge transistor ($N_{Clk}$) and then charged (High) by one of the pull-up stack transistors ($P_S$) if it is selected (i.e., if its RdWl input asserts Low) and its memory cell stores a Low, thereby turning on its cell transistor ($P_C$). So, in this embodiment, PMOS devices are used to charge the dynamic (evaluation) node during the read operation (evaluation phase). Meanwhile, NMOS devices are used to discharge (instead of precharge) the evaluation nodes, LBL and GBL, prior to evaluation.

FIG. 6 shows a NAND gate suitable for dynamic NAND gate 406 in accordance with some embodiments. As with the LBL evaluation nodes for the memory stack groups 402, its GBL evaluation node is discharged prior to an evaluation phase. During evaluation, depending on the state of a selected memory stack, it either stays Low or is pulled up through a P-type stack device ($P_S$). (It should be noted that while stack transistors ($P_S$) for both the stack cell groups and dynamic gate (NAND gate here) may or may not be the same in size and operational characteristics, depending on design concerns and configurations.)

There may be several advantages associated with using normally Low, pull-up evaluation nodes. For example, the number of stages needed to decode address input signals may be reduced, e.g., a NAND gate instead of an AND gate may be used. This effectively saves 1 stage delay from the total read-out delay and may compensate for increased delay due to the use of PMOS stack devices, which are generally slower than NMOS devices.

Also, the use of PMOS devices in the pull-up stack allows for further area optimization of the cell stack compared to the NMOS design resulting in improved array area density for similar cell stack sizing.

In addition, simulation results have indicated that the use of normally Low evaluation nodes (e.g., with a PMOS based stack circuit architecture) result in a reduction in leakage power (e.g., about 25%) and can improve noise immunity, albeit at the expense of a degradation in read-out delay for the same layout area.

Figure 7:
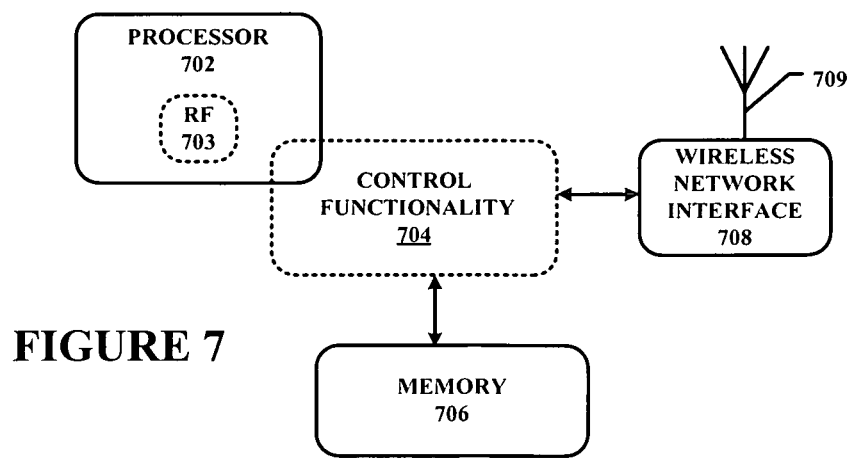
FIG. 7 is a diagram of a computer system having a processor with at least one register file circuit in accordance with some embodiments.

With reference to FIG. 7, one example of a portion of a computer platform (e.g., computing system such as a mobile personal computer, PDA, cell phone, or the like) is shown. The represented portion comprises one or more processors 702, interface control functionality 704, memory 706, wireless network interface 708, and an antenna 709. The processor(s) 702 is coupled to the memory 706 and wireless network interface 708 through the control functionality 704. The processor includes a register file 703 with normally Low, pull-up evaluation nodes in accordance with embodiments discussed herein. The control functionality may comprise one or more circuit blocks to perform various interface control functions (e.g., memory control, graphics control, I/O interface control, and the like. These circuits may be implemented on one or more separate chips and/or may be partially or wholly implemented within the processor(s) 702.

The memory 706 comprises one or more memory blocks to provide additional random access memory to the processor(s) 702. it may be implemented with any suitable memory including but not limited to dynamic random access memory, static random access memory, flash memory, or the like. The wireless network interface 708 is coupled to the antenna 709 to wirelessly couple the processor(s) 702 to a wireless network (not shown) such as a wireless local area network or a cellular network.

The computer platform may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The terms "P-type transistor" or "PMOS transistor" refer to a P-type metal oxide semiconductor field effect transistor. Likewise, "N-type transistor" or "NMOS transistor" refer to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   a register file circuit with a plurality of evaluation nodes that are discharged when entering an evaluation phase and read word line (RdWl) drivers that are asserted in response to a low voltage level, wherein P-type devices charge the evaluation nodes during a read operation and N-type devices discharge the evaluation nodes, the register file circuit comprising cell stack groups with local bit lines (LBLs) that discharge prior to being evaluated, the LBLs to feed NOR gates that provide pre-global bit lines (PGBLs) that are coupled with a dynamic NAND gate that outputs a global bit line (GBL) that is discharged low prior to evaluation.

2. The chip of claim 1, in which the circuit comprises memory cell stacks coupled to the evaluation nodes.

3. The chip of claim 2, in which the memory cell stacks comprise P-type transistors.

4. The chip of claim 3, in which the register file circuit comprises one or more cell stack groups each including a plurality of cell stacks coupled to a common local bit line that is to be discharged when beginning an evaluation phase.

5. The chip of claim 4, in which the register file circuit has global bit lines to evaluate the local bit lines, the global bit lines to be discharged when entering an evaluation phase.

6. The chip of claim 5, in which the register file circuit has a dynamic NAND gate to evaluate the global bit lines.

7. The chip of claim 1, comprising an N-type transistor coupled to each evaluation node to discharge it before each evaluation phase.

8. A method, comprising:
   reading a memory cell in a register, said reading including discharging an evaluation node with one or more N-type devices and evaluating the discharged evaluation node, wherein P-type devices charge the evaluation nodes during a read operation, the register comprises cell stack groups with local bit lines (LBLs) that discharge prior to being evaluated, the LBLs to feed NOR gates that provide pre-global bit lines (PGBLs) that are coupled with a dynamic NAND gate that outputs a global bit line (GBL) that is discharged low prior to evaluation.

9. The method of claim 8, in which discharging includes discharging the evaluation node through an N-type transistor between evaluation phases.

10. The method of claim 8, comprising charging the evaluation node to a High level during the evaluation phase if the memory cell turns on a P-type transistor coupled to the evaluation node.

11. The method of claim 10, wherein the evaluation node is one of a plurality of local bit lines in a column.

12. The method of claim 11, in which reading includes evaluating a global bit line that evaluates based on the local bit lines.

13. The method of claim 12, in which the global bit line is discharged when entering an evaluation phase.

* * * * *